United States Patent
Saraiya et al.

(10) Patent No.: US 7,153,632 B1
(45) Date of Patent: Dec. 26, 2006

(54) RADIATION-SENSITIVE COMPOSITIONS AND IMAGEABLE MATERIALS

(75) Inventors: Shashikant Saraiya, Fort Collins, CO (US); Heidi M. Munnelly, Windsor, CO (US); Frederic E. Mikell, Greeley, CO (US); Kevin D. Wieland, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/196,124

(22) Filed: Aug. 3, 2005

(51) Int. Cl.
*G03F 7/033* (2006.01)
*G03F 7/027* (2006.01)
*G03F 7/14* (2006.01)

(52) U.S. Cl. .............. 430/284.1; 430/281.1; 430/283.1; 430/302; 430/905; 430/910

(58) Field of Classification Search ........... 430/281.1, 430/283.1, 284.1, 302, 905, 910
See application file for complete search history.

(56) References Cited

U.S. PATENT DOCUMENTS

| 4,228,232 | A | 10/1980 | Rousseau |
| 5,919,600 | A | 7/1999 | Huang et al. |
| 6,582,882 | B1 | 6/2003 | Pappas et al. |
| 6,730,457 | B1 | 5/2004 | Saraiya et al. |
| 6,899,944 | B1 | 5/2005 | Tanaka et al. |
| 2003/0064318 | A1* | 4/2003 | Huang et al. ............ 430/270.1 |
| 2004/0260050 | A1 | 12/2004 | Munnelly et al. |
| 2005/0003285 | A1 | 1/2005 | Hayashi et al. |

FOREIGN PATENT DOCUMENTS

WO WO 2004/101280 11/2004

* cited by examiner

*Primary Examiner*—Richard L. Schilling
(74) *Attorney, Agent, or Firm*—J. Lanny Tucker

(57) ABSTRACT

A radiation-sensitive composition includes a radically polymerizable component that comprises carboxy groups, an initiator composition to generate radicals, and a polymeric binder comprising poly(alkylene oxide) segments and optionally pendant cyano groups. This composition can be used to prepare imageable elements such as negative-working, on-press developable printing plate precursors.

23 Claims, No Drawings

RADIATION-SENSITIVE COMPOSITIONS AND IMAGEABLE MATERIALS

FIELD OF THE INVENTION

This invention relates to radiation-sensitive compositions and imageable materials such as negative-working, on-press developable printing plate precursors. More particularly, it relates to radiation-sensitive compositions and imageable materials comprising an improved polymerizable component providing a coating with lower tackiness. The invention also relates to methods of using these compositions and imageable materials.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties and thereby imaging performance.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Radiation-sensitive compositions and imageable elements have also been designed for imagewise exposure and/or development while on a printing press using fountain solutions and/or printing inks, as described for example in U.S. Patent Application Publication 2004/0260050 (Munnelly et al.) and WO 2004/101280 (Munnelly et al.). These properties reduce the steps (for example, separate development) required for imaging and printing.

Radically polymerizable compositions that can be used in imageable elements are also described, for example, in U.S. Pat. No. 4,228,232 (Rousseau). Such compositions can be prepared using urethane oligomers that can comprise ethylenically unsaturated polymerizable groups as well as carboxy groups.

Problem to be Solved

Negative-working, on-press developable imageable elements are known, for example, from U.S. Pat. No. 6,582,882 (Pappas et al.) and U.S. Pat. No. 6,899,994 (Huang et al.) in which the imaging composition contains a polymeric binder comprising polyethylene oxide segments. Such polymeric binders have been found to enhance differentiation between exposed and unexposed image areas by facilitating the developability of the unexposed areas and the durability of the exposed image areas.

Such imaging compositions are also known to include radically polymerizable components that include urethane acrylates that polymerize upon thermal imaging. Such polymerizable components have been found to provide desired photospeed, run length, development, and solvent resistance, especially for on-press development.

However, we have found that the resulting dried coating containing a polymerized urethane acrylate may have undesirable tackiness that reduces manufacturing yield. Efforts to minimize this problem include reducing the coating thickness, but this leads to other problems and reduces overall printing plate performance including reduced photospeed and run length and weaker print out.

Thus, there is a need for improved radiation-sensitive compositions that when coated on suitable substrates, provide less tacky coatings without a loss in other desirable properties for imaging and development in printing plate precursors.

SUMMARY OF THE INVENTION

The present invention provides a radiation-sensitive composition comprising:
a radically polymerizable component,
an initiator composition capable of generating radicals sufficient to initiate polymerization of the radically polymerizable component upon exposure to imaging radiation, and
a polymeric binder,
wherein the polymeric binder has a hydrophobic backbone and comprises both the following a) and b) recurring units, or b) recurring units alone:
a) recurring units having pendant cyano groups attached directly to the hydrophobic backbone, and
b) recurring units comprising poly(alkylene oxide) segments, and
wherein the radically polymerizable component comprises carboxy groups.

In other aspects of this invention, an imageable element comprises a substrate having thereon an imageable layer comprising:
a radically polymerizable component,
an initiator composition capable of generating radicals sufficient to initiate polymerization of the radically polymerizable component upon exposure to imaging radiation, and
a polymeric binder,
wherein the polymeric binder has a hydrophobic backbone and comprises both the following a) and b) recurring units, or b) recurring units alone:
a) recurring units having pendant cyano groups attached directly to the hydrophobic backbone, and
b) recurring units comprising poly(alkylene oxide) segments, and
wherein the radically polymerizable component comprises carboxy groups.

Preferred embodiments comprise a negative-working, on-press developable, printing plate precursor comprising a hydrophilic substrate having thereon an imageable layer comprising:
a radically polymerizable component that is derived from the reaction of a multifunctional isocyanate with one or more urea urethane or urethane (meth)acrylates, an initiator composition comprising a halonium salt and an infrared absorbing compound having an anionic chromophore, and a polymeric binder present as discrete particles, wherein the polymeric binder has a hydrophobic backbone and comprises both of the following a) and b) recurring units:

a) recurring units having pendant cyano groups attached directly to the hydrophobic backbone, and b) recurring units comprising pendant poly(ethylene oxide) segments, and wherein the radically polymerizable component comprises carboxy groups sufficient to provide an acid number of from about 10 to about 20 mg KOH per gram of the radically polymerizable component.

This invention also provides a method of making a negative-working printing plate comprising:

A) imagewise exposing an imageable element described above, and

B) developing the imagewise exposed imageable layer.

The present invention has solved the problem of excess tackiness by using a combination of a specific polymeric binder and a specific radically polymerizable component in the radiation-sensitive composition. The polymeric binder has at least poly(alkylene oxide) segments and the polymerizable component comprises carboxy groups. In preferred embodiments, the carboxy groups are present in an amount sufficient to provide an acid number of from 5 to 50 mg KOH per gram of the polymerizable component. Thus, we found that tackiness was reduced while maintaining photo speed, visible print out, run length, and on-press developability without having to reduce the actual coating weight of the radiation-sensitive composition. While preferred embodiments of the invention are developable "on-press" to facilitate "computer-to-press" printing, the imageable elements of the present invention can also be developed "off-press" using conventional developers.

DETAILED DESCRIPTION OF THE INVENTION

Definitions

As used herein, "acid number" is the number of milligrams of KOH required to neutralize the carboxy groups in one gram of the radically polymerizable component defined herein.

Unless the context indicates otherwise, when used herein, the term "radiation-sensitive composition", "imageable element", and "printing plate precursor" are meant to be references to embodiments of the present invention.

In addition, unless the context indicates otherwise, the various components described herein such as "polymeric binders", "onium salts", "infrared absorbing compounds", "radically polymerizable component", and similar terms also refer to mixtures of such components. Thus, the use of the article "a" is not necessarily meant to refer to only a single component.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311(1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Radiation-Sensitive Compositions

One aspect of the present invention is a radiation-sensitive composition that may have any utility wherever there is a need for a coating that is polymerizable using suitable electromagnetic radiation, and particularly where it is desired to remove unexposed regions of the coated and imaged composition. The radiation-sensitive compositions can be used to prepare imageable elements such as printed circuit boards for integrated circuits and photomasks, preferably printed forms such as lithographic printing plate precursors and imaged printing plates that are defined in more detail below.

The radically polymerizable component present in the radiation-sensitive composition contains any polymerizable group that can be polymerized using free radical initiation. For example, the radically polymerizable component can contain an addition polymerizable ethylenically unsaturated group, a crosslinkable ethylenically unsaturated group, a ring-opening polymerizable group, an azido group, an aryldiazonium salt group, an aryldiazosulfonate group, or a combination thereof.

Suitable ethylenically unsaturated compounds that can be polymerized or crosslinked include ethylenically unsaturated polymerizable monomers that have one or more of the polymerizable groups, including unsaturated esters of alcohols, such as acrylate and methacrylate esters of polyols. Oligomers and/or prepolymers, such as urethane acrylates and methacrylates, epoxide acrylates and methacrylates, polyester acrylates and methacrylates, polyether acrylates and methacrylates, and unsaturated polyester resins can also be used.

Particularly useful radically polymerizable components comprise addition polymerizable ethylenically unsaturated groups including multiple acrylate and methacrylate groups and combinations thereof. More particularly useful radically polymerizable compounds include those derived from urea urethane (meth)acrylates, or urethane (meth)acrylates having multiple polymerizable groups. For example, a most preferred radically polymerizable component can be prepared by reacting DESMODUR® N100 aliphatic polyisocyanate resin based on hexamethylene diisocyanate (Bayer Corp., Milford Conn.) with hydroxy acrylate and pentaerythritol triacrylate.

Numerous other radically polymerizable compounds are known to those skilled in the art and are described in considerable literature including *Photoreactive Polymers: The Science and Technology of Resists*, A Reiser, Wiley, New York, 1989, pp. 102–177, by B. M. Monroe in *Radiation Curing: Science and Technology*, S. P. Pappas, Ed., Plenum, New York, 1992, pp. 399–440, and in "Polymer Imaging" by A. B. Cohen and P. Walker, in *Imaging Pro-*

*cesses and Material*, J. M. Sturge et al. Eds., Van Nostrand Reinhold, New York, 1989, pp. 226–262.

Besides the properties described above, the radically polymerizable component comprises carboxy groups, and in preferred embodiments, the carboxy groups are present in an amount sufficient to provide an acid number greater than 0 mg KOH per grams of polymerizable component, and generally from about 5 to about 50 mg KOH per gram of the polymerizable component. Preferably, the acid number is from about 5 to about 20 mg KOH/gram of polymerizable component and more preferably, it is from about 10 to about 20 mg KOH/gram of polymerizable component.

Radically polymerizable compounds containing carboxy groups can be prepared in a number of ways. For example, oligomers containing carboxy groups can be prepared as described for in the teaching of Col. 4 (line 42) to Col. 5 (line 19) and Col. 7 (line 14) to Col. 8 (line 45) of U.S. Pat. No. 4,228,232 (noted above) that is incorporated herein by reference. The carboxy groups can be added to the oligomers preferably after addition of the free radical polymerizable moieties by reaction of remaining hydroxy groups on the oligomer backbone with a compound having free carboxy groups (such as a dicarboxylic acid or anhydride). The resulting oligomers can be polymerized to provide a desired carboxy-substituted polymer.

Alternatively, a poly(urea urethane)acrylate or poly(urethane)acrylate can be prepared from the reaction of a diisocyanate with a diol having free carboxy groups similarly to the preparation of allyl functional polyurethanes described in U.S. Pat. No. 5,919,600 (Huang et al.) that is incorporated by reference.

Specific radically polymerizable compounds useful in this invention are Polymers A–E that are described below prior to the Examples along with particularly useful methods of preparing them.

The radically polymerizable component is present in the radiation-sensitive composition in an amount sufficient to render the composition insoluble in an aqueous developer after exposure to radiation. For example, the weight ratio of radically polymerizable component to polymeric binder is generally from about 5:95 to about 95:5, preferably from about 10:90 to about 90:10, and more preferably from about 30:70 to about 70:30.

The radiation-sensitive composition includes an initiator composition for initiating a polymerization reaction upon imagewise exposure of the composition. The initiator composition may be responsive, for example, to electromagnetic radiation in the ultraviolet, visible and/or infrared spectral regions, corresponding to the spectral range of from about 300 to about 1400 nm. UV and visible light sensitivity is generally from about 300 to about 700 nm. Preferably, the initiator composition is responsive to infrared radiation in the range of from about 700 to about 1400 nm.

Suitable initiator compositions include one or more components that generate free radicals including but not limited to, benzoyl peroxide, hydroperoxides such as cumyl hydroperoxide, azo compounds such as azo bis-isobutyronitrile, 2,4,5-triarylimidazolyl dimers (hexaarylbisimidazoles) as described for example in U.S. Pat. No. 4,565,769 (Dueber et al.), trihalomethyl triazines alone or with a photosensitizer as described in U.S. Pat. No. 4,997,745 (Kawamura et al.), diaryliodonium salts and a photosensitizer, 3-ketocoumarins for UV and visible light activation, borate and organoborate salts such as those described in U.S. Pat. No. 6,562,543 (Ogata et al.), and onium salts. Other known initiator composition components are described for example in U.S. Patent Application Publication 2003/0064318 (noted above), incorporated herein by reference.

The preferred initiator compositions include an onium salt including but not limited to, a sulfonium, oxysulfoxonium, oxysulfonium, sulfoxonium, ammonium, selenonium, arsonium, phosphonium, diazonium, or halonium salt. Further details of useful onium salts, including representative examples, are provided in U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.), that are all incorporated herein by reference. For example, suitable phosphonium salts include positive-charged hypervalent phosphorus atoms with four organic substituents. Suitable sulfonium salts such as triphenylsulfonium salts include a positively-charged hypervalent sulfur with three organic substituents. Suitable diazonium salts possess a positive-charged azo group (that is —N≡N$^+$). Suitable ammonium salts include a positively-charged nitrogen atom such as substituted quaternary ammonium salts with four organic substituents, and quaternary nitrogen heterocyclic rings such as N-alkoxypyridinium salts. Suitable halonium salts include a positively-charged hypervalent halogen atom with two organic substituents. The onium salts generally include a suitable number of negatively-charged counterions such as halides, hexafluorophosphate, thiosulfate, hexafluoroantimonate, tetrafluoroborate, and others readily apparent to one skilled in the art.

The halonium salts are more preferred, and the iodonium salts are most preferred. In one preferred embodiment, the onium salt has a positively-charged iodonium, (4-methylphenyl)[4-(2-methylpropyl)phenyl]- moiety and a suitable negatively charged counterion. A representative example of such an iodonium salt is available as Irgacure® 250 from Ciba Specialty Chemicals (Tarrytown, N.Y.) that is iodonium, (4-methylphenyl)[4-(2-methylpropyl)phenyl], hexafluorophosphate and is supplied in a 75% propylene carbonate solution.

The free radical generating compounds in the initiator composition are generally present in the radiation-sensitive composition in an amount of at least 1% and up to 20%, based on composition dry weight. Preferably, such compounds are present in an amount of from about 2% to about 8%.

The polymeric binder useful in the present invention, which is described fully in U.S. Pat. No. 6,899,994 (noted above) that is incorporated herein by reference, has a hydrophobic backbone and comprises both of the following a) and b) recurring units, or the b) recurring units alone:

a) recurring units having pendant cyano groups attached directly to the hydrophobic backbone, and b) recurring units having pendant groups comprising poly(alkylene oxide) segments.

Thus, the polymeric binder comprises poly(alkylene oxide) segments and preferably poly(ethylene oxide) segments. These polymers can be graft copolymers having a main chain polymer and poly(alkylene oxide) side chains or block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof. Poly(ethylene oxide) and poly(propylene oxide) segments are preferred and poly(ethylene oxide) segments are most preferred.

In some embodiments, the polymeric binders contain only recurring units comprising poly(alkylene oxide) segments, but in other embodiments, the polymeric binders comprise recurring units comprising the poly(alkylene oxide) segments as well as recurring units having pendant cyano groups attached directly to the hydrophobic backbone. By way of example only, such recurring units can comprise pendant groups comprising —CN, cyano-substituted or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.) that is incorporated herein by reference.

By way of example, the polymeric binder can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ester methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

Other polymeric binders useful in the present invention can include the a) and b) or b) only recurring units described above, in addition to recurring units comprising siloxane functionality as described for example in U.S. Pat. No. 7,045,271 (Tao et al.), that is incorporated herein by reference.

Mixtures of different polymeric binders can be used. For example, a polymeric binder containing pendant cyano groups can be used in combination with a polymeric binder devoid of cyano groups. Alternatively, a combination of different polymeric binders devoid of cyano groups can be used. In addition, mixtures of graft copolymers, mixtures of block copolymers, and mixtures of both graft copolymers and block copolymers can be used.

The amount of the poly(alkylene oxide) segments in the graft copolymers is from about 0.5 to about 60 weight %, preferably from about 2 to about 50 weight %, more preferably from about 5 to about 40 weight %, and most preferably from 5 to 20 weight %. The amount of (alkylene oxide) segments in the block copolymers is generally from about 5 to about 60 weight %, preferably from about 10 to about 50 weight %, and more preferably from about 10 to about 30 weight %. At the lower levels of (alkylene oxide) segments in the polymeric binders, developability may be decreased whereas at the higher levels, ink receptivity of the imaged areas may decrease.

The polymeric binder is present in the radiation-sensitive composition in an amount sufficient to render the radiation-sensitive composition soluble or dispersible in an aqueous developer. Generally, this amount is from about 10 to about 90 weight %, preferably from about 20 to about 70 weight % and more preferably from 30 to 60 weight %.

The polymeric binders useful in this invention are solids and generally have a glass transition ($T_g$) temperature of from about 35 to about 220° C., preferably from about 45 to about 140° C., and more preferably from about 50 to about 130° C., as measured using conventional procedures.

In addition, the polymeric binders generally have a number average molecular weight ($M_n$) of from about 2,000 to about 2,000,000. Preferably, the number average molecular weight of the poly(alkylene oxide) segments is from about 300 to about 10,000 and more preferably from about 500 to about 5,000.

In preferred embodiments, the polymeric binder is present in the form of discrete particles, including a mixture of discrete particles of multiple polymers that are suspended and dispersed (usually uniformly dispersed) in the radiation-sensitive composition. These discrete particles tend to promote on-press developability of unexposed areas. In particularly preferred compositions, discrete particles of at least one graft copolymer are present. By discrete particles, we mean particles that range in size from about 60 to about 300 nm in diameter (or largest dimension).

In addition to the polymeric binders described above containing poly(alkylene oxide) segments, the radiation-sensitive composition can also include one or more "co-binders" that do not contain poly(alkylene oxide) segments. However, when such co-binders are present, they comprise less than 35% based on the total polymeric binder weight. Useful co-binders include but are not limited to, cellulosic polymers, poly(vinyl alcohols), polymers derived from (meth)acrylic acid, poly(vinyl pyrrolidones), polymers of meth(acrylates), polyesters, polyacetals, and mixtures thereof. Such co-binders can also provide crosslinkable sites.

In embodiments of the invention that are sensitive to infrared radiation, the radiation-sensitive compositions can further comprise an infrared radiation absorbing compound ("IR absorbing compounds") that absorbs radiation from about 600 to about 1200 nm and preferably from about 700 to about 1100 nm. It is particularly useful for such IR absorbing compounds to be used in combination with onium salts to enhance polymerization of the polymerizable component and to produce a more durable printing plate.

Examples of suitable IR dyes include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polyrnethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.) that is incorporated herein by reference.

Cyanine dyes having an anionic chromophore are particularly useful in the preferred embodiments of the present invention. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are especially useful for on-press developable radiation-sensitive compositions and imageable elements as described for example in U.S. Patent Application Publication 2005-0130059 (Tao).

A general description of one class of suitable cyanine dyes is shown by the formula in paragraph 0026 of WO 2004/101280, incorporated herein by reference, and two specific examples of useful IR absorbing compounds are identified below with the Examples as IR Absorbing Dyes I and II.

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. 4,973,572 (DeBoer).

Useful IR absorbing compounds include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

The radiation absorbing compound can be present in the radiation-sensitive composition in an amount sufficient to render the composition insoluble to an aqueous developer after exposure to appropriate radiation. This amount is generally at least 0.1% and up to 20% and preferably from about 0.05 to about 5%, based on total dry layer weight. Alternatively, the amount can be defined by an absorbance in the range of from about 0.05 to about 3, and preferably from about 0.1 to about 1.5, in the dry film as measured by reflectance UV-visible spectrophotometry. The particular amount needed for this purpose would be readily apparent to one skilled in the art, depending upon the specific compound used.

Alternatively, the radiation absorbing compounds may be included in a separate layer that is in thermal contact with the radiation-sensitive imaging layer containing the radiation sensitive composition. Thus, during imaging, the action of the radiation absorbing compound can be transferred to the imaging layer without the compound originally being incorporated into the same layer.

The radiation-sensitive composition of this invention may be sensitive to UV radiation wherein the free-radical generating compound is UV radiation sensitive. Typical UV radiation-sensitive free-radical generating compounds include trichloromethyl triazines as described, for example, in U.S. Pat. No. 4,997,745 (Kawamura et al.) and diaryliodonium salts. Secondary co-initiators can be used, such as titanocenes, polycarboxylic acids, haloalkyl triazines, hexaaryl bisimidazoles, borate salts, and photooxidants containing a heterocyclic nitrogen that is substituted by an alkoxy or acyloxy group, as described in U.S. Pat. No. 5,942,372 (West et al.). The UV radiation-sensitive compound is typically present in amount of 1–20% by weight of the dry film.

Other materials that may be present in the UV radiation-sensitive composition include a polymeric binder, for example, styrene-acrylonitrile-poly(ethylene oxide) graft copolymer in an amount of 10–70 weight %, a radically polymerizable component in an amount of 10–60 weight %, a photooxidant component in an amount of 0.1–5 weight %, dyes and colorants in an amount of 0.5–15 weight %, viscosity builders in an amount of 0.1–15 weight %, surfactants in an amount of 0.25–5 weight %, and other polymeric binders not containing poly(ethylene oxide), such as poly(methyl methacrylate), in an amount of 1–30 weight %.

The radiation-sensitive composition can also include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

In some embodiments, the radiation-sensitive composition also includes a mercaptan derivative such as a mercaptotriazole such as 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole. Various mercaptobenzimidazoles, mercaptobenzthiazoles, and mercaptobenzoxazoles may also be present.

Imageable Elements

The imageable elements are formed by suitable application of a radiation-sensitive composition as described above to a suitable substrate. This substrate is usually treated or coated in various ways as described below prior to application of the radiation-sensitive composition. Preferably, there is only a single imageable layer comprising the radiation-sensitive composition of this invention. If the substrate has been treated to provide an "interlayer" for improved adhesion or hydrophilicity, the applied radiation-sensitive composition is considered the "top" layer.

The substrate generally has a hydrophilic surface, or at least a surface that is more hydrophilic than the applied radiation-sensitive composition on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyltriethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet is anodized using phosphoric acid or sulfuric acid and conventional procedures.

An interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid copolymer, poly(acrylic acid), or acrylic acid copolymer. Preferably, the aluminum support is treated with poly(acrylic acid) using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaged cylinders is described for example in U.S. Pat. No. 5,713,287 (Gelbart).

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder).

Illustrative of such methods is mixing the polymeric binder and other components of the radiation-sensitive composition in a suitable organic solvent [such as methyl ethyl ketone (2-butanone), methanol, ethanol, iso-propyl alcohol, acetone, n-propanol, and others readily known in the art, as well as mixtures thereof], dispersing the resulting solution in an aqueous medium, applying the resulting dispersion on a substrate, and removing the solvent(s) by evaporation under suitable drying conditions. After proper drying, the coating weight of the imageable layer is generally from about 0.1 to about 5 g/m$^2$, preferably from about 0.5 to about 3.5 g/m$^2$, and more preferably from about 0.5 to about 1.5 g/m$^2$.

The imageable element may further comprise an overcoat layer that may serve as an oxygen barrier by comprising an oxygen-impermeable compound, that is, a compound that prevents the diffusion of oxygen from the atmosphere into the imageable layer during the lifetime of the free radicals generated by radiation exposure. The overcoat can also serve as a barrier to moisture. The overcoat layer should be soluble, dispersible, or at least permeable to the developer. The overcoat layer can also be designed to prevent physical or chemical damage to the imageable element from handling, transportation, or overexposure.

Underlayers can also be present under the imageable layer to enhance developability or to act as a thermal insulating layer. The underlying layer should be soluble or at least dispersible in the developer and preferably have a relatively low thermal conductivity coefficient.

The imageable elements have any useful form including, but not limited to, printing plate precursors, printing cylinders, printing sleeves and printing tapes (including flexible printing webs). Preferably, the imageable members are printing plate precursors.

Printing plate precursors can be of any useful size and shape (for example, square or rectangular) having the requisite imageable layer disposed on a suitable substrate. Printing cylinders and sleeves are known as rotary printing members having the substrate and imageable layer in a cylindrical form. Hollow or solid metal cores can be used as substrates for printing sleeves.

Imaging Conditions

During use, the imageable element is exposed to a suitable source of radiation such as UV, visible light, or infrared radiation, depending upon the radiation absorbing compound present in the radiation-sensitive composition, at a wavelength of from about 300 to about 1400 nm. Preferably, imaging is carried out using an infrared laser at a wavelength of from about 700 to about 1100 nm. The laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1060 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. An examples of an useful imaging apparatus is available as models of Creo Trendsetter® imagesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 mJ/cm$^2$, and more particularly from about 75 to about 400 mJ/cm$^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, as Fujitsu Thermal Head FTP-040 MCS001 and TDK Thermal Head F415 HH7-1089).

Without the need for any wet processing or separate development after imaging, the imaged element is preferably directly mounted on press wherein the unexposed areas are removed by a suitable fountain solution and/or ink during the initial impressions. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

However, the imaged elements can also be developed off press using conventional processing and a conventional aqueous developer. The aqueous developer composition is dependent upon the nature of the polymeric binder, but common components include surfactants, chelating agents (such as salts of ethylenediaminetetraacetic acid), organic solvents (such as benzoyl alcohol), and alkaline components (such as inorganic metasilicates, organic metasilicates, hydroxides, and bicarbonates). The pH of the aqueous developer is preferably from about 5 to about 14.

Following development, a postbake operation can be carried out.

Printing (and simultaneously on-press development) can be carried out by applying a lithographic ink and fountain solution to the imaged element printing surface. The fountain solution is taken up by the nonimaged regions that is the surface of the hydrophilic substrate revealed by the imaging and development steps, and the ink is taken up by the imaged (unremoved) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

EXAMPLES

The following examples are provided to illustrate the practice of the invention but are by no means intended to limit the invention in any manner.

The components and materials used in the examples and analytical methods used in evaluation were as follows:

MEK is methyl ethyl ketone.

DMAC is dimethyl acetamide.

Desmodur® N100 is an aliphatic polyisocyanate based on hexamethylene diisocyanate (available from Mobay/Bayer).

Sartomer 399 is dipentaerythritol pentaacrylate that is available from Sartomer Company (Exton, Pa.) and it is added to a formulation as an 80 wt. % solution in 2-butanone.

Sartomer 355 is ditrimethylolpropane tetraacrylate that is available from Sartomer Company (Exton, Pa.).

Irgacure® 250 is a 75 wt. % solution of iodonium, (4-methoxyphenyl)[4-(2-methylpropyl)phenyl]-, hexafluorophosphate in propylene carbonate that is available from Ciba Specialty Chemicals (Tarrytown, N.Y.).

IR absorbing Dye I was obtained from Eastman Kodak Company and is represented by the following formula:

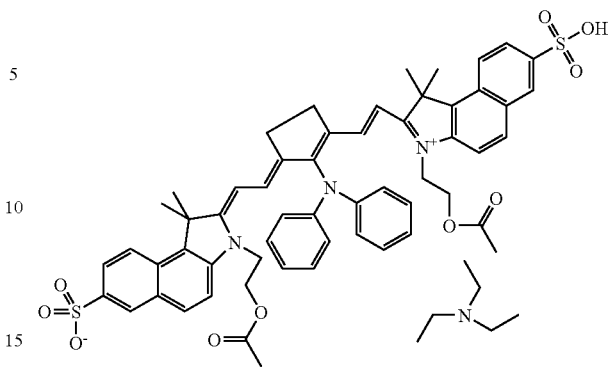

IR absorbing dye II was obtained from Showa Denko (Japan) and is represented by the following formula:

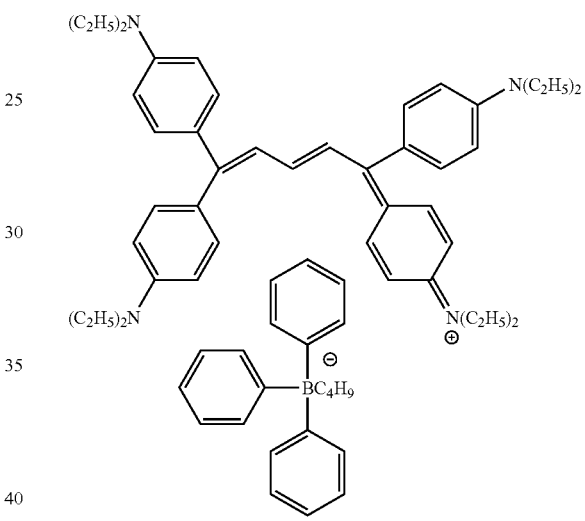

Graft Copolymer is a 24 wt. % dispersion in an 80/20 mixture of n-propanol/water comprising Copolymer 9 described in paragraph 0138 of U.S. Patent Application Publication 2004-0260050, incorporated herein by reference. Copolymer 9 was derived from poly(ethylene glycol) methyl ether methacrylate (average $M_n$ of 2080), styrene, and acrylonitrile at a weight ratio of 10:9:81 of the three monomers.

Mercapto-3-triazole refers to mercapto-3-triazole-1H,2,4 that is available from PCAS (Paris, France).

Byk® 336 is a modified dimethyl polysiloxane copolymer that is available from Byk Chemie (Wallingford, Conn.) in a 25 wt. % xylene/methoxypropyl acetate solution.

Klucel® M is a hydroxypropyl cellulose thickener used as a 1 wt. % aqueous solution that is available from Hercules (Heverlee, Belgium).

ELVACITE 4026 is a 10 wt. % solution in 2-butanone of a highly-branched poly(methyl methacrylate) that is available from Ineos Acrylica, Inc. (Cordova, Tenn.).

The following radically polymerizable components (polymers) were prepared and used in the Examples below:

Synthesis of Polymer A:

Methyl ethyl ketone (66.6 g), Desmodur® N100 [95.5 g, 0.5 equivalent), hydroxylethyl acrylate (16.2 g, 0.135 equivalent), pentaerythritol triacrylate [87.91 g, 0.213 equivalent, Viscoat-300, available from Osaka Chemical, Japan), hydroquinone (0.0455 g), dimethyl acetamide (29.07 g), and hydroxybenzoic acid (22.70 g, 0.165 equivalent) were charged into a four-necked 500 ml flask fitted with a heating mantle, temperature controller, mechanical stirrer, condenser and nitrogen inlet. After 10 minutes of stirring at room temperature, the reaction mixture was heated to 40° C., dibutyltin dilaurate (0.1 g) was added, and the reaction mixture was exothermed to 60° C. During processing, dibutyltin dilaurate (0.8 g) was added in two increments. Completion of reaction was determined by the disappearance of an isocyanate infrared absorption band at 2275 cm$^{-1}$. The resulting clear solution had a kinematic viscosity of "F-" (G.H'33) at 60% non-volatile and the resulting Polymer A had an acid number of 41.5 mg KOH/g of Polymer A. The ratio of MEK/DMAC was 80:20.

Synthesis of Polymer B:

Methyl ethyl ketone (53.75 g), Desmodur® N-100 [95.5 g, 0.5 equivalent), hydroxylethyl acrylate (30.6 g, 0.255 equivalent), pentaerythritol triacrylate [88.7 g, 0.215 equivalents, Viscoat-300 available from Osaka Chemical, Japan), and hydroquinone (0.043 g) were charged into a four-necked 500 ml flask fitted with a heating mantle, temperature controller, mechanical stirrer, condenser, and nitrogen inlet. After 10 minutes of stirring at room temperature, the reaction mixture was heated to 40° C., dibutyltin dilautate (0.14 g) was added, and the reaction mixture was exothermed to 63° C. Four hours later percent —NCO, which was measured by titration method, was on theoretical. Later, MEK (64.6 g), dimethyl acetamide (29.6 g) and hydroxybenzoic acid (6.9 g, 0.0499 equivalent) were added. During processing, dibutyltin dilaurate (0.34 g) was added in two increments and the reaction mixture was heated to 70° C. Completion of reaction was determined by the disappearance of isocyanate infrared absorption band at 2275 cm$^{-1}$. The resulting clear solution had a kinematic viscosity of "B-" (G.H'33) at 60% non-volatile and the resulting Polymer B had an acid number of 12.6 mg KOH/g of Polymer B. The ratio of MEK/DMAC was 80:20.

Synthesis of Polymer C:

Methyl ethyl ketone (115.4 g), Desmodur® N-100 [95.5 g, 0.5 equivalents), hydroxyethyl acrylate (17.4 g, 0.145 equivalents), pentaerythritol triacrylate [83.73 g, 0.203 equivalents, Viscoat-300, available from Osaka Chemical, Japan), hydroquinone (0.0445 g), dimethyl acetamide (24.24 g), and glycolic acid (12.54 g, 0.165 equivalents) were charged into a four necked 500 ml flask fitted with a heating mantle, temperature controller, mechanical stirrer, condenser, and nitrogen inlet. After 10 minutes of stirring at room temperature, the reaction mixture was heated to 40° C., dibutyltin dilaurate (0.1 g) was added, and the reaction mixture was exothermed to 60° C. During processing, dibutyltin dilaurate (0.6 g) was added in two increments. Completion of the reaction was determined by the disappearance of an isocyanate infrared absorption band at 2275 cm$^{-1}$. The resulting clear solution had a kinematic viscosity of "H" (G.H'33) at 60% non-volatile and the resulting Polymer C had an acid number of 44.2 mg KOH/g of Polymer C. The ratio of MEK/DMAC was 83:17.

Synthesis of Polymer D:

Methyl ethyl ketone (148.7 g), Desmodur® N-100 [95.5 g, 0.5 equivalent), hydroxyethyl acrylate (16.2 g, 0.135 equivalents), pentaerythritol triacrylate [87.91 g, 0.213 equivalents, Viscoat-300, available from Osaka Chemical, Japan), and hydroquinone (0.0445 g) were charged into a four necked 500 ml flask fitted with a heating mantle, temperature controller, mechanical stirrer, condenser, and nitrogen inlet. After 10 minutes of stirring at room temperature, the reaction mixture was heated to 40° C., dibutyltin dilaurate (0.13 g) was added, and the reaction mixture was exothermed to 60° C. Two hours later, the % —NCO was on theoretical as was measured by a titration method. The reaction mixture was cooled to 30° C. and dimethyl acetamide (33.4 g) and p-amino benzoic acid (22.62 g, 0.0499 equivalents) were added. During processing, dibutyltin dilaurate (0.2 g) was added in two increments and the reaction mixture was heated to 35° C. Completion of reaction was determined by the disappearance of an isocyanate infrared absorption band at 2275 cm$^{-1}$. The resulting clear solution had a kinematic viscosity of "J+" (G.H'33) at 60% non-volatile and the resulting Polymer D had an acid number of 41.5 mg KOH/g of Polymer D. The ratio of MEK/DMAC was 82:18.

Synthesis of Polymer E:

Methyl ethyl ketone (116.0 g), Desmodur® N-100 [95.5 g, 0.5 equivalents), hydroxyethyl acrylate (30 g, 0.25 equivalents), pentaerythritol triacrylate [86.6 g, 0.21 equivalents, Viscoat-300, available from Osaka Chemical, Japan), and hydroquinone (0.043 g) were charged into a four necked 500 ml flask fitted with a heating mantle, temperature controller, mechanical stirrer, condenser, and nitrogen inlet. After 10 minutes of stirring at room temperature, the reaction mixture was heated to 40° C., dibutyltin dilaurate (0.14 g) was added, and the reaction mixture was exothermed to 60° C. Two hours later, the % —NCO was on theoretical as was measured by a titration method. The reaction mixture was cooled to 35° C. and dimethyl acetamide (29.2 g) and p-amino benzoic acid (6.86 g, 0.05 equivalents) were added. During processing, dibutyltin dilaurate (0.8 g) was added in two increments and the reaction mixture was heated to 45° C. Completion of the reaction was determined by the disappearance of an isocyanate infrared absorption band at 2275 cm$^{-1}$. The resulting clear solution had a kinematic viscosity of "B+" (G.H'33) at 60% non-volatile and the resulting Polymer E had an acid number of 12.8 mg KOH/g of Polymer E. The ratio of MEK/DMAC was 80:20.

Tack Assessment of Imageable Elements:

A dry, clean finger was pressed on the radiation-sensitive coating of the imageable element for 3 seconds. While lifting the imageable element vertically, the height it reached before it fell from the finger was measured. The greater the distance the imageable element was raised with the finger, the higher its tackiness. This test was performed as a means to evaluate any improvement in tackiness.

Examples 1 and 2

The radiation-sensitive compositions described in the following TABLE I were applied to a treated aluminum substrate to a give a dry coating weight of either 1.0 g/m$^2$ or 1.5 g/m$^2$ containing either Polymer E (Example 1) or B (Example 2). The compositions were applied using a wire-wound rod and then dried for approximately 45 seconds residence time in a conveyor oven set at 90° C. The aluminum substrate had been brush-grained and phosphoric acid anodized and post-treated with poly(acrylic acid).

TABLE I

| Component | Parts by Weight Percent |
|---|---|
| Polymer E (Example 1) and Polymer B (Example 2)[1] | 1.93 |
| Sartomer 399 | 1.45 |
| Graft Copolymer | 4.83 |
| Irgacure ® 250 | 0.30 |
| IR absorbing Dye I | 0.19 |
| Mercapto-3-triazole | 0.13 |
| Byk ® 336 | 0.42 |
| Klucel ® M | 4.63 |
| ELVACITE 4026 | 2.32 |
| n-Propanol | 54.03 |
| 2-Butanone | 15.97 |
| Water | 13.81 |

[1]Polymers E and B were 60 wt. % in MEK/DMAC 80:20 with an acid number of 12.8 mg KOH/g of Polymer E and 12.6 mg KOH/g of Polymer B.

The resulting printing plate precursors for Examples 1 and 2 having a dry coating weight of 1.0 g/m² were imaged on a conventional Creo Trendsetter® 3244x imagesetter at 300 mJ/cm² and then mounted directly onto a conventional Komori press. The press conditions were chosen to accelerate plate wear. The press was charged with an abrasive ink containing 1.5% of calcium carbonate and a fountain solution that was Varn Litho Etch 142W and Varn PAR alcohol replacement each at 3 oz per gallon (23.4 ml/liter) for printing plate development.

The resulting printing plates containing Polymers B and E both provided 40,000 copies of good quality prints before solid wear was observed. Both of these printing plates were developed by printed sheet 1. No changes in development, compared to a fresh printing plate, were noted after the printing plates were treated for 5 days at either 48° C. or 38° C./80% relative humidity.

For the tackiness assessment, the printing plate precursor having a dry coating weight of 1.5 g/m² containing Polymer E (Example 1) was lifted to <1 inch (2.54 cm) before it fell to the table. The printing plate precursor having a dry coating weight of 1.5 g/m² containing Polymer B (Example 2) was lifted 4 inches (10.2 cm) before it fell to the table. The printing plate precursors containing either Polymer E or B in the dry coating weight of 1.0 g/m² were lifted <1 inch (2.54 cm) before they fell to the table.

These results demonstrate that the radically polymerizable polymers comprising urea-urethane acrylates containing carboxy groups and having a lower acid number sufficiently provided an imageable radiation-sensitive composition and coating that had excellent tack resistance, development, run length and shelf life as compared to radically polymerizable polymers comprising urethane acrylates containing carboxy groups.

Example 3

The radiation-sensitive composition described in the following TABLE II was applied to a treated aluminum substrate to a give a dry coating weight of 1.0 g/m² and containing Polymer D. The composition was applied using a wire-wound rod and then dried for approximately 45 seconds residence time in a Ranar conveyor oven set at 90° C. The aluminum substrate was electrochemically-grained and sulfuric acid anodized and was post-treated with poly (vinyl phosphonic acid).

TABLE II

| Component | Parts by Weight Percent |
|---|---|
| Polymer D[1] | 1.60 |
| Sartomer 355 | 0.88 |
| Graft Copolymer | 8.66 |
| Irgacure ® 250 | 0.28 |
| IR absorbing dye II | 0.09 |
| Mercapto-3-triazole | 0.12 |
| Byk ® 336 | 0.40 |
| Klucel ® M | 4.41 |
| n-Propanol | 51.72 |
| 2-Butanone | 18.40 |
| Water | 13.44 |

[1]Polymer D was a 55 wt. % solution in MEK/DMAC 82/18 with an acid number of 41.5 mg KOH/g.

The resulting plate precursor for Example 3 was imaged and developed on-press as described for Examples 1 and 2 above. The plate developed poorly on press and the press was stopped after 1,000 copies due to insufficient development.

For the tackiness assessment, the printing plate precursor was lifted <1" (2.54 cm) before it fell to the table.

While improving the overall tackiness of the radiation-sensitive composition and coating, the higher acid number of the carboxy-containing polymerizable component reduced on-press developability. Such an imageable element, however, would be useful for off-press development.

Examples 4 and 5

The radiation-sensitive compositions described in the following TABLE III were applied to a treated aluminum substrate to a give a dry coating weight of 1.0 g/m² containing Polymer A (Example 4) or Polymer C (Example 5). The compositions were applied using a wire-wound rod and then dried for approximately 45 seconds residence time in a Ranar conveyor oven set at 90° C. The aluminum substrate was electrochemically-grained and sulfuric acid anodized and was post-treated with poly(vinyl phosphonic acid).

TABLE III

| Component | Parts by Weight Percent |
|---|---|
| Polymer A (Example 4) and Polymer C (Example 5)[1] | 1.60 |
| Sartomer 355 | 0.88 |
| Graft Copolymer | 8.66 |
| Irgacure ® 250 | 0.28 |
| IR absorbing dye II | 0.09 |
| Mercapto-3-triazole | 0.12 |
| Byk ® 336 | 0.40 |
| Klucel ® M | 4.41 |
| n-Propanol | 51.72 |
| 2-Butanone | 18.40 |
| Water | 13.44 |

[1]Polymer A was a 60 wt. % solution in MEK/DMAC 80:20 and Polymer C was a 60 wt. % solution in MEK/DMAC 83:17. The acid number for Polymer A was 41.5 mg KOH/g of Polymer A and was for Polymer C, 44.2 mg KOH/g of Polymer C.

The resulting plate precursors for Examples 4 and 5 were imaged and developed on-press as described for Examples 1 and 2 above. The printing plates developed poorly on press and the press was stopped after 1,000 copies due to incomplete development.

For the tackiness assessment, the printing plate precursors were lifted <1" (2.54 cm) before they fell to the table.

While improving the overall tackiness of the radiation-sensitive composition and coating, the higher acid number of the carboxy-containing polymerizable component reduced on-press developability. Such imageable elements, however, would be useful for off-press development.

Comparative Example

The radiation-sensitive composition described in the following TABLE IV was applied to a treated aluminum substrate to a give a dry coating weight of either 1.0 g/m² or 1.5 g/m². The composition was applied using a wire-wound rod and then dried for approximately 45 seconds residence time in a Ranar conveyor oven set at 90° C. The aluminum substrate was brush-grained and phosphoric acid anodized and post-treated with poly(acrylic acid).

TABLE IV

| Component | Parts by Weight Percent |
|---|---|
| Urethane Acrylate X polymer[1] | 1.45 |
| Sartomer 399 | 1.45 |
| Graft Copolymer | 4.83 |
| Irgacure ® 250 | 0.30 |
| IR absorbing dye I | 0.19 |
| Mercapto-3-triazole | 0.13 |
| Byk ® 336 | 0.42 |
| Klucel ® M | 4.63 |
| Elvacite 4026 | 2.32 |
| n-Propanol | 54.03 |
| 2-Butanone | 16.45 |
| Water | 13.81 |

[1]Urethane Acrylate X polymer was supplied in an 80 wt. % solution in 2-butanone and was prepared by reacting DESMODUR ® N100 (an aliphatic polyisocyanate resin based on hexamethylene diisocyanate from Bayer Corp., Milford, CT) with hydroxyethyl acrylate and pentaerythritol triacrylate. It has an acid number of 0 mg KOH/g polymer.

The resulting plate precursor for this Comparative Example was imaged and developed on-press as described above for Examples 1 and 2. The printing plate was used to print 40,000 copies of good quality prints before solid wear was observed. Development of this plate was completed by printed sheet 1. Compared to the fresh plate, no changes in development were noted after the plate was treated for 5 days at either 48° C. or 38° C./80% relative humidity.

For the tackiness assessment, the printing plate precursor having a dry coating weight of 1.5 g/m² was lifted 4 inches (10.2 cm) before it fell to the table. The printing plate precursor having a dry coating weight of 1.0 g/m² was lifted 2 inches (5.1 cm) before it fell to the table.

With an acid number of 0 mg KOH/g of polymer, use of the Urethane Acrylate X polymer in the radiation-sensitive composition resulted in an imageable coating with excellent run length, on-press development and shelf-life but it provided poor tack resistance.

The invention has been described in detail with particular reference to certain preferred embodiments thereof, but it will be understood that variations and modifications can be effected within the spirit and scope of the invention.

The invention claimed is:

1. A radiation-sensitive composition comprising:
   a radically polymerizable component,
   an initiator composition capable of generating radicals sufficient to initiate polymerization of said radically polymerizable component upon exposure to imaging radiation, and
   a polymeric binder,
   wherein said polymeric binder has a hydrophobic backbone and comprises both the following a) and b) recurring units, or b) recurring units alone:
   a) recurring units having pendant cyano groups attached directly to said hydrophobic backbone, and
   b) recurring units comprising poly(alkylene oxide) segments, and
   wherein said radically polymerizable component is derived from the reaction of a multifunctional isocyanate compound and one or more urea urethane (meth) acrylates or urethane (meth)acrylates comprising carboxy groups.

2. The composition of claim 1 wherein said radically polymerizable component comprises carboxy groups sufficient to provide an acid number of from about 5 to about 50 mg KOH per gram of said radically polymerizable component.

3. The composition of claim 2 wherein said radically polymerizable component comprises carboxy groups sufficient to provide an acid number of from about 5 to about 20 mg KOH per gram of said radically polymerizable component.

4. The composition of claim 1 wherein said initiator composition comprises an onium salt.

5. The composition of claim 1 wherein said polymeric binder is a graft polymer comprising pendant poly(alkylene oxide) segments, or said polymeric binder is a block copolymer having at least one poly(alkylene oxide) block and at least one non-poly(alkylene oxide) block.

6. The composition of claim 1 wherein said polymeric binder comprises recurring units derived from (meth)acrylonitrile.

7. An imageable element comprising a substrate having thereon an imageable layer comprising:
   a radically polymerizable component,
   an initiator composition capable of generating radicals sufficient to initiate polymerization of said radically polymerizable component upon exposure to imaging radiation, and
   a polymeric binder,
   wherein said polymeric binder has a hydrophobic backbone and comprises both the following a) and b) recurring units, or b) recurring units alone:
   a) recurring units having pendant cyano groups attached directly to said hydrophobic backbone, and
   b) recurring units comprising poly(alkylene oxide) segments, and
   wherein said radically polymerizable component is derived from the reaction of a multifunctional isocyanate compound and one or more urea urethane (meth) acrylates or urethane (meth)acrylates comprising carboxy groups.

8. The element of claim 7 wherein said radically polymerizable compound comprises carboxy groups sufficient to provide an acid number of from about 5 to about 50 mg KOH per gram of said radically polymerizable component.

9. The element of claim 8 wherein said radically polymerizable component comprises carboxy groups sufficient to provide an acid number of from about 5 to about 20 mg KOH per gram of said radically polymerizable component.

10. The element of claim 7 wherein said radically polymerizable comprises carboxy groups sufficient to provide an acid number of from about 10 to about 20 mg KOH per gram of said radically polymerizable component.

11. The element of claim 7 wherein said initiator composition comprises an onium salt.

12. The element of claim 11 wherein said initiator composition comprises a sulfonium, oxysulfoxonium, oxysulfonium, sulfoxonium, ammonium, selenonium, arsonium, phosphonium, diazonium, or halonium salt.

13. The element of claim 7 further comprising an infrared radiation absorbing compound that is a carbon black or an IR-sensitive dye.

14. The element of claim 7 comprising an iodonium salt and an infrared radiation absorbing compound having an anionic chromophore.

15. The element of claim 7 further comprising an UV radiation absorbing compound and a polymeric binder comprising pendant cyano groups.

16. The element of claim 7 wherein said imageable layer comprises discrete particles of said polymeric binder.

17. The element of claim 8 wherein said substrate is a phosphoric acid anodized, poly(acrylic acid)-treated aluminum substrate.

18. A negative-working, on-press developable, printing plate precursor comprising a hydrophilic substrate having thereon an imageable layer comprising:
    a radically polymerizable component that is derived from the reaction of a multifunctional isocyanate with one or more urea urethane (meth)acrylate or urethane (meth) acrylates,
    an initiator composition comprising a halonium salt and an infrared absorbing compound having an anionic chromophore, and
    a polymeric binder present as discrete particles,
    wherein said polymeric binder has a hydrophobic backbone and comprises both of the following a) and b) recurring units:
    a) recurring units having pendant cyano groups attached directly to said hydrophobic backbone, and
    b) recurring units comprising pendant poly(ethylene oxide) segments, and
    wherein said radically polymerizable component comprises carboxy groups sufficient to provide an acid number of from about 10 to about 20 mg KOH per gram of said radically polymerizable component.

19. A method of making a negative-working printing plate comprising:
    A) imagewise exposing an imageable element comprising a substrate having thereon an imageable layer comprising:
        a radically polymerizable component,
        an initiator composition capable of generating radicals sufficient to initiate polymerization of said radically polymerizable component upon exposure to imaging radiation, and
        a polymeric binder,
        wherein said polymeric binder has a hydrophobic backbone and comprises both the following a) and b) recurring units, or b) recurring units alone:
        a) recurring units having pendant cyano groups attached directly to said hydrophobic backbone, and
        b) recurring units comprising poly(alkylene oxide) segments, and
        wherein said radically polymerizable component is derived from the reaction of a multifunctional isocyanate compound and one or more urea urethane (meth) acrylates or urethane (meth)acrylates comprising carboxy groups, and
    B) developing said imagewise exposed imageable layer.

20. The method of claim 19 wherein said radically polymerizable component comprises carboxy groups sufficient to provide an acid number of from about 5 to about 50 mg KOH per gram of said radically polymerizable component.

21. The method of claim 19 wherein one or both of steps A and B are carried out on-press.

22. The method of claim 19 wherein:
    said imageable element comprises a hydrophilic substrate and an infrared absorbing compound having an anionic chromophore,
    said radically polymerizable component comprises carboxy groups sufficient to provide an acid number of from about 10 to about 20 mg KOH per gram of said radically polymerizable component,
    said initiator composition comprises a halonium salt, and
    said polymeric binder is present as discrete particles and has a hydrophobic backbone and comprises both the a) and b) recurring units.

23. The method of claim 22 wherein imagewise exposing step A is carried out using radiation having a maximum wavelength of from about 700 to about 1100 nm, and developing step B is carried out on-press using an ink, fountain solution, or a combination of both.

* * * * *